US011557502B2

(12) United States Patent
Posseme

(10) Patent No.: US 11,557,502 B2
(45) Date of Patent: Jan. 17, 2023

(54) METHOD FOR FORMING TRENCHES

(71) Applicant: COMMISSARIAT A L'ENERGIE ATOMIQUE ET AUX ENERGIES ALTERNATIVES, Paris (FR)

(72) Inventor: Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 290 days.

(21) Appl. No.: 16/925,857

(22) Filed: Jul. 10, 2020

(65) Prior Publication Data
US 2021/0013089 A1 Jan. 14, 2021

(30) Foreign Application Priority Data

Jul. 11, 2019 (FR) ...................................... 19 07806

(51) Int. Cl.
*H01L 21/762* (2006.01)
*H01L 21/306* (2006.01)
*H01L 21/033* (2006.01)
*H01L 21/3065* (2006.01)
*H01L 21/308* (2006.01)

(52) U.S. Cl.
CPC .... *H01L 21/76224* (2013.01); *H01L 21/0337* (2013.01); *H01L 21/3065* (2013.01); *H01L 21/3086* (2013.01); *H01L 21/30608* (2013.01)

(58) Field of Classification Search
CPC ........... H01L 21/76224; H01L 21/0337; H01L 21/3086; H01L 21/30608; H01L 21/3065
See application file for complete search history.

(56) References Cited

U.S. PATENT DOCUMENTS 5,933,749 A * 8/1999 Lee .................. H01L 21/76232
257/E21.549
6,093,621 A * 7/2000 Tseng ................ H01L 21/76224
257/E21.546

(Continued)

OTHER PUBLICATIONS

French Preliminary Search Report dated Mar. 10, 2020 in French Application 19 07806 filed on Jul. 11, 2019 (with English Translation of Categories of Cited Documents & Written Opinion), 10 pages.

(Continued)

*Primary Examiner* — Michael M Trinh
(74) *Attorney, Agent, or Firm* — Oblon, McClelland, Maier & Neustadt, L.L.P.

(57) ABSTRACT

A method is provided for forming at least one trench to be filled with an isolating material to form an isolating trench, in a substrate based on a semiconductor material, the method including at least the following successive steps: providing a stack including at least the substrate, a first hard mask layer, and a second hard mask layer; making at least a first opening and a second opening, by carrying out isotropic etchings; performing a third, anisotropic, etching of the substrate in line with the second opening, so as to obtain the at least one trench; performing a fourth, isotropic, etching of the first layer so as to enlarge the first opening and obtain a first enlarged opening; and performing a fifth, anisotropic, etching so as to simultaneously enlarge the second opening and increase a depth of the at least one trench.

18 Claims, 8 Drawing Sheets

(56) References Cited

U.S. PATENT DOCUMENTS

| | | | | |
|---|---|---|---|---|
| 6,110,797 A * | 8/2000 | Perry | ................ | H01L 21/76224 |
| | | | | 257/E21.549 |
| 6,238,999 B1 * | 5/2001 | Dickerson | ......... | H01L 21/76232 |
| | | | | 438/424 |
| 9,111,994 B2 * | 8/2015 | Won | ................... | H01L 21/76229 |
| 2009/0263919 A1 * | 10/2009 | Hori | ................... | H01L 21/02238 |
| | | | | 257/E21.283 |
| 2014/0187050 A1 * | 7/2014 | Posseme | ........... | H01L 21/31122 |
| | | | | 438/717 |
| 2015/0118805 A1 * | 4/2015 | Rideau | ................ | H01L 21/3105 |
| | | | | 438/433 |

OTHER PUBLICATIONS

Extended European Search Report dated Nov. 27, 2020 in European Application No. 20185217.5, (with Translation of Category of Cited Documents), 9 pages.

* cited by examiner

METHOD FOR FORMING TRENCHES

TECHNICAL FIELD

The present invention relates to a method for producing trenches intended to be filled with an isolating material to form electrical isolation trenches between microelectronic components. It will find an advantageous application in the production of shallow isolation trenches called STI (Shallow Trench Isolation) by reducing or even avoiding the formation of residues or defects in or around the STIs.

STATE OF THE ART

In the field of microelectronic technologies, the lateral electrical isolation between components, in particular between transistors, is generally done by structures based on silicon oxide.

Historically, these structures were formed by local oxidation of silicon, and called LOCOS (for LOCal Oxidation of Silicon). Faced with the increasing reduction in the dimensions of transistors, LOCOS structures have proved unsuitable for the isolation of transistors with sub-micron sizes.

In particular, the methods of forming these LOCOS structures generate a lateral LOCOS outgrowth, also known as a "bird's beak". This outgrowth related to the diffusion of oxidising species under the hard mask causes the consumption of part of the active area. The surface density of integration of the transistors is thus limited.

Another disadvantage of LOCOS-type methods is the diffusion and segregation of the boron dopant under the hard mask. This results in "short channel" effects which are detrimental to the performance of the transistor.

Another disadvantage of LOCOS-type methods is that the oxidation depth of silicon is directly related to the spacing between two active areas. When active areas are close to each other, the depth of these LOCOS isolation structures is reduced. When there is a multitude of different spacings between two active areas, the depth of these LOCOS isolation structures is not uniform.

To overcome all these disadvantages, many integration solutions have been proposed. For example, the SILO (for Sealed Interface Local Oxidation) method limits the diffusion of oxidation under the hard mask and the appearance of "bird's beak" by nitriding prior to oxidation. SWAMI (Side-Wall Mask Isolation) type methods involve the etching of a small isolation trench, followed by LOCOS-type oxidation. The NCL (for Nitride-Clad LOCOS) method with oxide removal under the hard mask, followed by nitride deposition and then local oxidation has allowed to extend the LOCOS-type isolation to the CMOS technological node 0.25 μm.

However, from this technological node, the LOCOS were gradually replaced by isolation trenches STI (for Shallow Trench Isolation), which are more efficient and much less expensive than the many necessary adaptations of the LOCOS.

The STIs are in the shape of side trenches separating the transistors from one another, filled by silicon oxide deposition SiO2. The integration of STI (also known as the "STI brick") occurs at the start of the integrated circuit manufacturing process. The steps of designing STI are illustrated and briefly detailed below. Typically, etching steps allow the trenches to be formed in the substrate. These trenches are then filled so as to form the STIs.

As illustrated in FIG. 1A, the silicon substrate 10 is covered with a stack of layers 20, 12 which constitute a hard mask. This hard mask allows to control the etching profile of the trenches. The hard mask typically comprises a layer of thermal $SiO_2$ 20 (called pedestal oxide or padox) and a thicker layer 12 of silicon nitride $Si_3N_4$ generally deposited by a low pressure chemical vapour deposition process (or LPCVD for Low Pressure Chemical Vapour Deposition). Additional layers of amorphous oxide or carbon (a-C:H) can be added to this stack, so as to optimise the etching of the trenches (uniformity, roughness, profile).

The STI formation areas are then defined by photolithography (FIGS. 1B, 1C, 1D). A layer of photosensitive resin 15 is deposited on the stack 20, 12 constituting the hard mask (FIG. 1B), then insolated through a mask 200 (FIG. 1C). The insolated resin portions 15b are then removed while the unmodified resin portions 15a are retained (FIG. 1D).

An anisotropic etching (FIG. 1E) allows the hard mask to be opened and the front face 110 of the substrate 10 to be exposed, between the portions 15a.

Another anisotropic etching allows the trenches 100a to be formed in the silicon substrate 10 (FIG. 1F). A first parameter influencing the quality of the filling of the trenches 100a by depositing a filling material 100b is the slope profile of the side walls of the trenches 100a.

Vertical side walls 101a do not promote uniform and complete filling. Indeed, the CVD deposition of $SiO_2$ oxide generally leads in this case to the formation of shoulders in the oxide layer 16 on the top of the trenches (FIG. 1G). Access to the bottom of the trenches is thus reduced. The filling is not done optimally.

As the oxide deposition continues, the entrance orifice to the trench closes while leaving a cavity 102a within the STI 100 (FIG. 1H).

Depending on the etching parameters (type of chemistry used, polarisation of the substrate for example), in particular if it is not perfectly anisotropic, side walls 101b having a barrel profile can also be formed (FIG. 1I). Such walls 101b also do not promote a uniform and complete filling of the trench 100a.

One solution to improve the filling of the trenches 100a consists in forming inclined side walls 101c (FIG. 1J). This at least partly compensates for the formation of shoulders at the top of the trenches. Access to the bottom of the trenches is improved. Such trenches with inclined side walls therefore have a variable width depending on the depth. This variation in width nevertheless remains relatively small, of the order of 5 nm or less, and the width of the trenches can in this case be assimilated to an average width.

An additional solution consists in oxidising, generally by heat treatment between 850° C. to 1050° C. under an oxidising atmosphere, the walls 101c and the bottom of the trenches so as to form a thin layer of oxidation 21 called a liner (FIG. 1K), prior to the oxide deposition.

This helps to create a good interface between the substrate 10 and the filler oxide 100b. This interface allows to prevent the formation of defects in the walls, these defects being able to disrupt the operation of the final devices.

The trenches are then filled with a filler oxide 100b (FIG. 1L) using CVD (Chemical Vapour Deposition) techniques. Annealing is carried out so as to densify this filler oxide 100b.

The excess filler oxide is partly removed by chemical mechanical polishing CMP (FIG. 1M). The hard mask 12 is then removed so as to expose the active areas where the transistors will be formed. The excess filling of the trenches is also levelled and the STIs 100 are thus formed (FIG. 1N).

The quality of the STIs 100 therefore depends in particular on the quality of the filler oxide 100b, which must be dense, on the quality of the interface between the silicon of the substrate and the filler oxide, which must be free from defects, and the quality of the filling itself, which must be carried out without any formation of cavities within the filler oxide.

These cavities 102a, 102b may be buried in the filler oxide (FIG. 2A), or may open onto the top of the trench (FIG. 2B).

The latter, called open cavities 102b, can be particularly problematic during the steps of forming the metal gates of the transistors. To form these gates, very highly doped polycrystalline silicon (poly-Si) is deposited both on the active areas and on the STIs. It is then removed by dry etching on the STIs. Nevertheless, this removal is difficult in the open cavities of the filler oxide. Poly-Si residues may remain and link active areas to one another. Two adjacent active areas normally electrically isolated from one another by the STI are therefore short-circuited by an electrical connection via this poly-Si. The efficiency of the transistors is reduced.

The cavities 102a buried in the STIs are less critical. They can nevertheless evolve into open cavities 102b thereafter.

It is therefore particularly important to develop methods for filling isolation trenches which prevent the formation of cavities in the filler oxide.

Furthermore, these filling methods must be adapted to changes in the dimensions of the STIs. In particular, the minimum width of the trenches is reduced with each new technological node and, consequently, the maximum shape factor (ratio of the depth of an STI to its width) increases.

In order to improve the filling of trenches having a reduced width, one solution consists in carrying out a lateral hard mask removal after etching the trenches and before forming the liner (FIGS. 3A, 3B). This lateral removal is carried out by wet etching ($H_3PO_4$). It allows to obtain additional space over a width δ at the edge of the entrance orifice to the trenches, before filling (FIG. 3B). This prior lateral removal allows a reduction in the number of cavities during oxide deposition.

A known method for forming STI in a substrate of SOI (Silicon on Insulator) type allowing to obtain this lateral removal comprises the following successive steps illustrated in FIGS. 4A to 4G:

Providing a stack comprising at least the substrate 10, a first hard mask layer 11 and a second hard mask layer 12, and optionally other layers (for example anti-reflective layers 14) improving the definition and/or the etching of the trench patterns (FIG. 4A), Performing an anisotropic etching of the first hard mask layer 11 and of the second hard mask layer 12, in a main direction substantially normal to the front face of the substrate 10, so as to expose at least part of the substrate 10 through openings 111, 112 having a width x1 (FIG. 4B), Performing an anisotropic etching of the substrate 10 in the main direction, so as to obtain at least one trench 100a having a depth Z and an average width substantially equal to x1, said at least one trench 100a extending as a continuation of the openings 111, 112 in the main direction (FIG. 4C), Removing the first hard mask layer 11 so as to expose the second hard mask layer 12 having a thickness z3 and the openings 112 (FIG. 4D), Performing an isotropic etching of the second hard mask layer 12 so as to enlarge the openings 112 so that they have widths x2 with x2>x1, the second hard mask layer 12 having a residual thickness z4, said isotropic etching being carried out by wet etching using a solution based on phosphoric acid (H3PO4) (FIG. 4E), Filling the trenches 100a with a filler oxide 100b (FIG. 4F), Removing an excess filler oxide 100b by chemical mechanical polishing, and removing the second hard mask layer 12, so as to form the STI 100 (FIG. 4G).

A disadvantage of this method is the formation of phosphorus residues within the STIs or at the interface between the STI 100 and the substrate 10. These phosphorus residues can degrade the electrical performance of the transistors.

Different solutions for removing these phosphorus residues have been proposed.

A hot wet cleaning based on NH4OH:H2O2:H2O allows to remove these phosphorus residues. However, this cleaning is not compatible with transistor architectures based on silicon-germanium (SiGe). In particular, PMOS areas comprising SiGe risk being consumed by such cleaning.

A wet cleaning based on hydrofluoric acid (HF) allows to partly remove these phosphorus residues. However, its efficiency is limited. This HF cleaning can further laterally consume the buried oxide BOX of the SOI substrate. This consumption of the BOX leads to an increase in the number of defects when filling the trenches with the filler oxide.

The present invention aims at overcoming some of the disadvantages mentioned above.

A general purpose of the present invention is to reduce the risk of the appearance of cavities in the isolation trenches while preserving the electrical performance of the transistors.

Another purpose of the present invention is to provide a solution for reducing, or even eliminating, phosphorus residues during the formation of isolation trenches in a substrate, in particular in an SOI type substrate.

The other objects, features and advantages of the present invention will become apparent upon examining the following description and the accompanying drawings. It is understood that other advantages can be incorporated.

SUMMARY

To achieve the purposes mentioned above, the present invention provides according to a first aspect a method for forming at least one trench intended to be filled with an isolating material to form an isolating trench, in a substrate based on a semiconductor material, the at least one trench extending within the substrate from a front face of the substrate, comprising at least the following successive steps:

Providing a stack comprising at least the substrate, a first hard mask layer and a second hard mask layer, the second layer being interposed between the substrate and the first layer;

Making at least a first opening and a second opening extending respectively through the first layer and the second layer. The first opening is made by a first, anisotropic, etching of the first layer, so as to expose at least part of the second layer. The second opening is made by a second anisotropic etching of the second layer in line with the first opening so as to expose a part of the front face of the substrate in line with the second opening;

Performing a third, anisotropic, etching of the substrate in line with the second opening, so as to obtain at least one trench;

Performing a fourth, isotropic, etching of the first layer so as to enlarge the first opening and obtain a first enlarged opening;

Performing a fifth, anisotropic, etching of the second layer in line with the first enlarged opening and of the substrate in line with the second opening, so as to simultaneously enlarge the second opening and increase the depth of the trench.

This solution thus provides for performing at least two anisotropic etchings of the substrate (the third and fifth etchings) to form the trenches while enlarging the second opening. In particular, the third etching allows to partially form the trench in the substrate and the fifth etching allows to increase the depth of the trench in the substrate, while enlarging the second opening of the hard mask. This allows to avoid the use of isotropic chemistries to enlarge the second opening of the hard mask and in particular to avoid the use of $H_3PO_4$ based chemistries.

This fifth etching preferably, but without limitation, has little or no selectivity (that is to say, about 1:1 selectivity) between the material of the second layer and the material of the substrate. The materials of the substrate and of the second layer are therefore etched with approximately equal etching rates. This allows to facilitate the determination of the etching time required to achieve the desired etching depths for the second enlarged opening and for the deep trench. The efficiency of the fifth etching is thus improved. This also allows to avoid the use of selective chemistries of these two materials and in particular to avoid the use of $H_3PO_4$-based chemistries.

This solution advantageously allows to avoid the formation of phosphorus residues, unlike the solution known for enlarging the second opening by wet etching using a solution based on phosphoric acid ($H_3PO_4$). The steps of cleaning these phosphorus residues prior to filling the trenches, and the disadvantages related to these steps, are therefore eliminated.

This solution thus allows to enlarge the second opening of the second hard mask layer so as to have a wider section at the entrance to the trench to facilitate the filling of the trench. The filling of at least one trench can therefore be improved.

According to another aspect, provision is made of a method for forming an isolation trench comprising the formation of a trench by implementing the method mentioned above and comprising at least one step of filling said trench with an isolating material. The quality of the isolation trenches, for example of the STI type, formed after filling the trenches is thus improved.

This solution is particularly advantageous for the formation of STI in a substrate of the SOI (Silicon on Insulator) type. This solution is also particularly advantageous for the formation of STIs in architectures of transistors based on silicon-germanium (SiGe), and/or for the formation of STI in architectures of transistors of FDSOI (fully depleted semiconductor on insulator) type or FinFET. This solution is also particularly advantageous for the formation of STI having a reduced width, in particular for the STIs formed at the most recent technological nodes.

This solution is particularly efficient and easily reproducible.

The present invention thus provides an efficient solution to the problem of providing a method for forming isolation trenches within a semiconductor substrate, which improves the production of STI and the performance of the device.

BRIEF DESCRIPTION OF THE FIGURES

The purposes, objects, as well as the features and advantages of the invention will become more apparent from the detailed description of embodiments thereof which are illustrated by the following accompanying drawings wherein:

FIG. 1I shows a profile called barrel profile. FIG. 1J shows a profile called inclined profile.

Figure 1A:
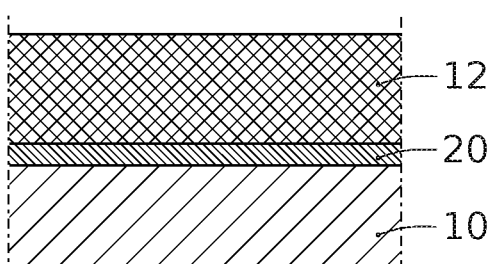
FIGS. 1A to 1F schematically illustrate in section different steps of forming a trench according to solutions of the prior art.
Figure 1D:
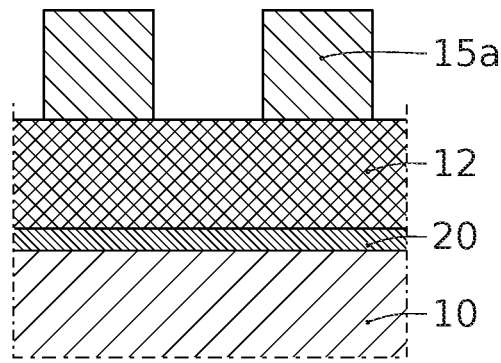
Figure 1B:
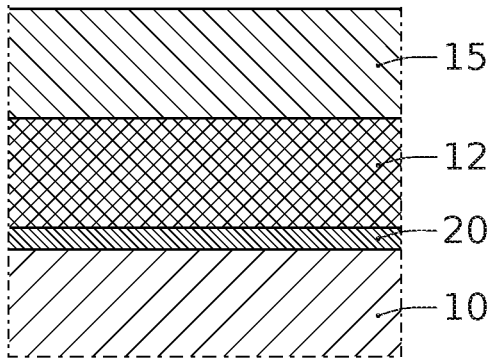
Figure 1E:
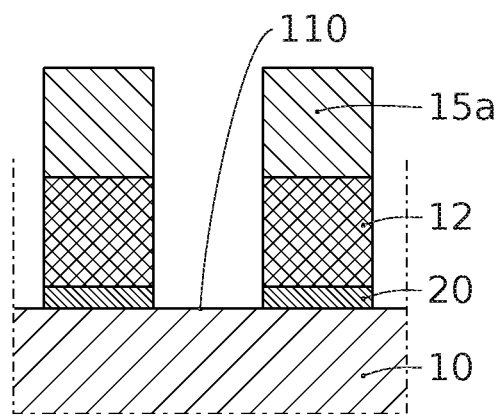
Figure 1C:
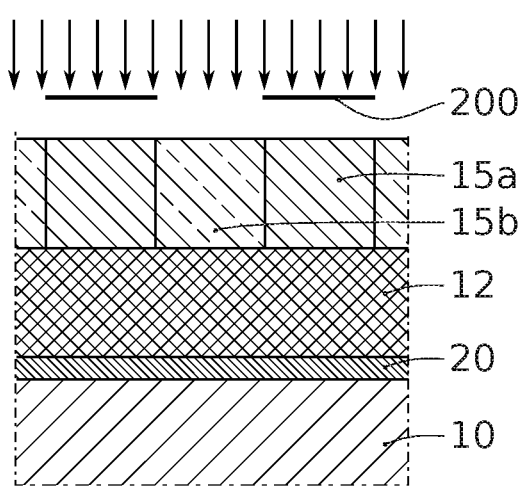
Figure 1F:
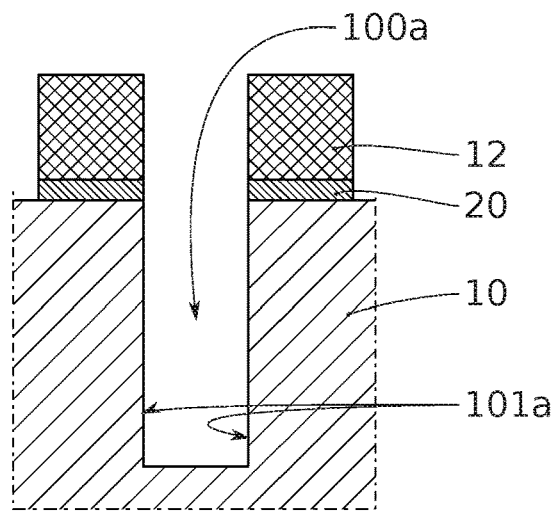
Figure 1G:
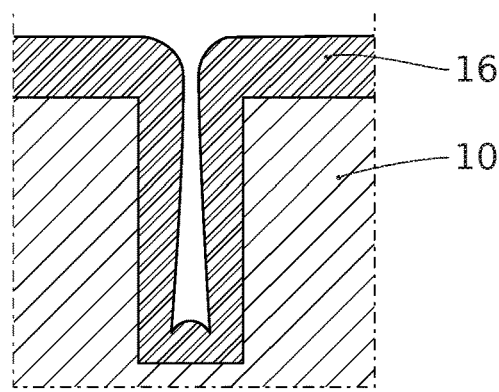
FIGS. 1G and 1H schematically illustrate in section a problem related to the filling of a trench as shown in FIG. 1F.
Figure 1H:
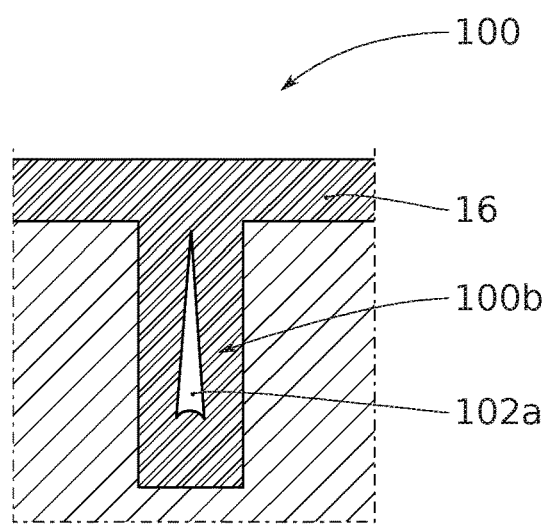
Figure 1I:
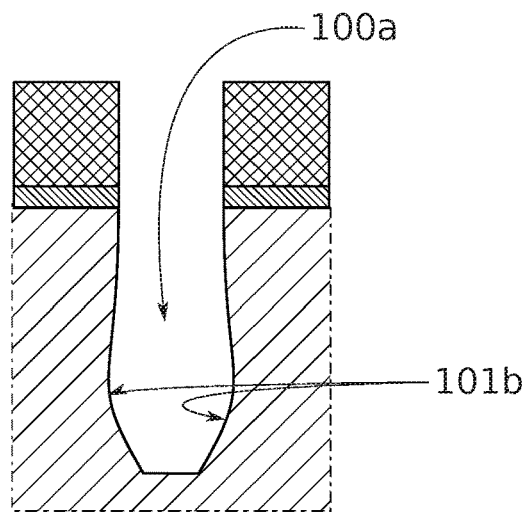
FIGS. 1I and 1J schematically illustrate in section alternative trench profiles to that of a trench as shown in FIG. 1F.
Figure 1J:
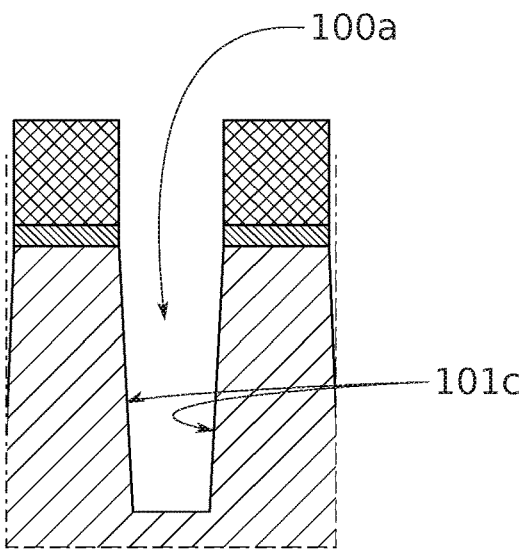
Figure 1K:
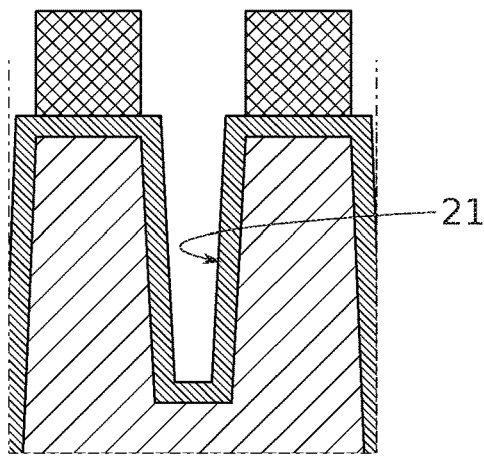
FIGS. 1K and 1L schematically illustrate in section different steps of filling a trench as shown in FIG. 1J according to solutions of the prior art.
Figure 1L:
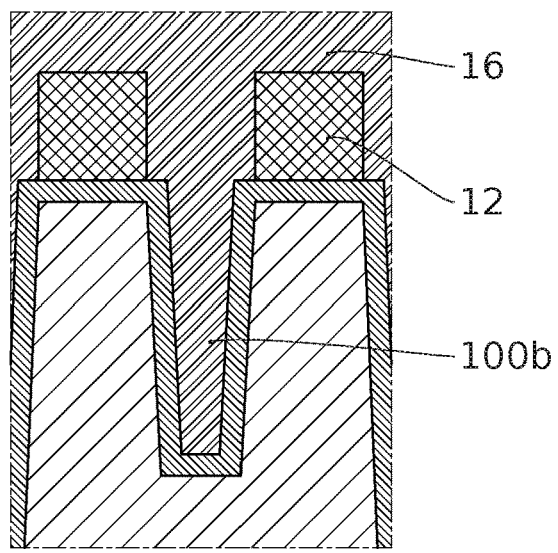
Figure 1M:
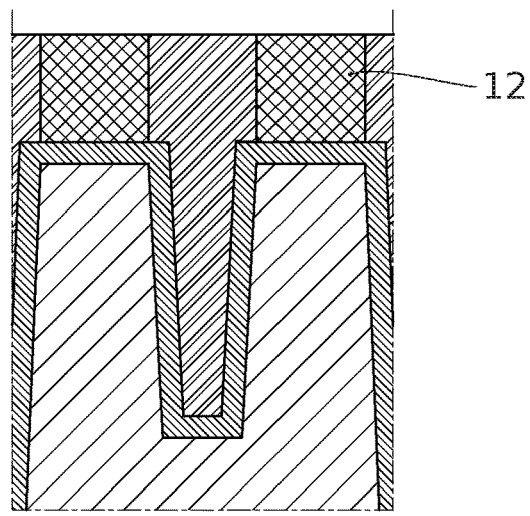
FIGS. 1M and 1N schematically illustrate in section different steps, according to solutions of the prior art, aiming at individualising the TSIs as shown in FIG. 1L, by exposing the active areas.
Figure 1N:
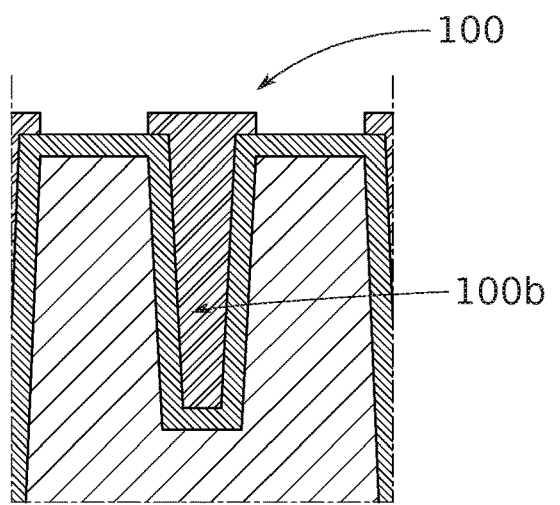
Figure 2A:
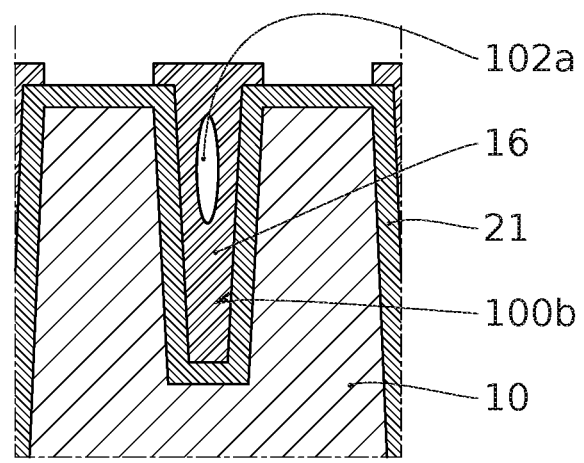
FIGS. 2A and 2B schematically illustrate cavities formed within the STI according to solutions of the prior art.
Figure 2B:
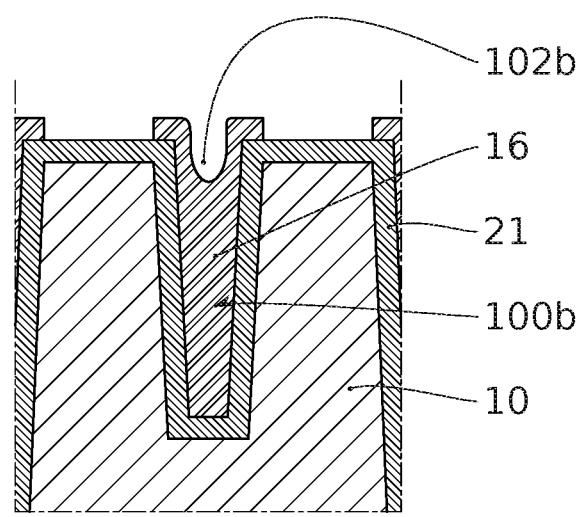
Figure 3A:
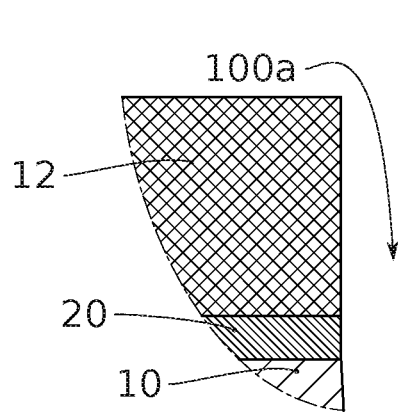
FIGS. 3A and 3B schematically illustrate a known solution improving the filling of trenches and reducing the formation of cavities within STIs.
Figure 3B:
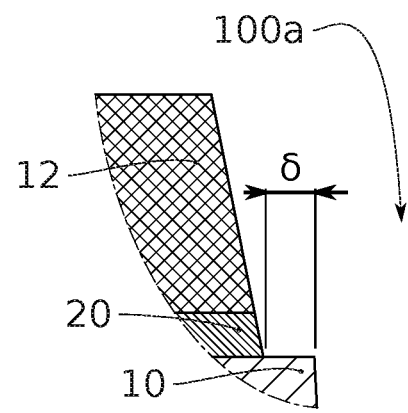

The drawings are given by way of examples and are not limiting of the invention. They constitute schematic principle representations intended to facilitate the understanding of the invention and are not necessarily on the scale of practical applications. In particular, the dimensions of the different layers and structures (trenches, liner) are not representative of reality. Moreover, to facilitate the understanding of the invention, the side walls of the trenches are shown vertical and parallel in the figures, while it is desirable for these walls to be inclined as will be indicated below. For the sake of clarity of the illustrations, some very thin layers are not necessarily shown.

DETAILED DESCRIPTION

Before starting a detailed review of embodiments of the invention, it is recalled that, optionally, the invention comprises at least any one of the following optional features which may be used in combination or alternatively.

According to one example, the at least one first opening has a width x1 in the first layer at the end of the first etching. According to one example, the at least one second opening has a width substantially equal to x1 in the second layer at the end of the second etching and extends as a continuation of the at least one first opening in the main direction.

According to one example, the trench made in the substrate also has a width x1 since it extends as a continuation of the second opening.

According to one example, at the end of the fourth etching, the first opening is enlarged and has a width x2>x1. At the end of the fifth etching, the second opening is enlarged and has a width equal to x2 because it is made in line with the first enlarged opening. According to one example, the dimensions x1 and x2 are measured in the same direction, parallel to the main plane wherein the substrate mainly extends. Preferably, this dimension corresponds to a width of the opening. In this plane parallel to the main plane wherein the substrate mainly extends, the length of the trench corresponds to the largest dimension of the trench and the width corresponds to a dimension perpendicular to the length.

According to one example, the fifth etching is stopped before consuming the entire second layer in line with the first enlarged opening. Thus, the section of the trench, taken in a plane parallel to the main plane wherein the substrate mainly extends, corresponds to the section of the second non-enlarged opening.

According to one example, the first anisotropic etching of the first layer is performed in a main direction substantially normal to the front face of the substrate. According to one example, the second, anisotropic, etching of the second layer is performed in the main direction.

According to one example, the first, second, third and fifth etchings are carried out anisotropically in a main direction substantially perpendicular to the front face of the substrate.

According to one example, the substrate is an SOI-type substrate comprising a layer made of a semiconductor material, a support layer called bulk and a buried oxide layer called BOX interposed between the layer made of a semiconductor material and the support layer. Alternatively, the substrate is a solid substrate.

At the end of the third etching the trench has a depth $z1$. According to one example, the second hard mask layer has a thickness $z3$ and the fifth anisotropic etching is configured so as to etch the second hard mask layer along the thickness $z3$ for an etching time $t$ at an etching rate $v512$, and to etch the substrate to a depth $z2$ for the same etching time $t$, at an etching rate $v510$, such that $Z=z1+z2$, $Z$ being the depth of the trench at the end of the fifth etching. This allows the second opening to be enlarged over the entire thickness of the second layer while deepening the trench.

According to one example, the etching rates $v512$ and $v510$ are equal so that $z2=z3$. This makes it easier to determine the etching time $t$.

According to one example, the etching rate $v510$ is greater than the etching rate $v512$ so that $z2>z3$. This allows to optimise the deepening of the trench during the fifth etching.

According to one example, the method further comprises, after the fifth etching, a selective removal of the first hard mask layer with respect to the second hard mask layer and the substrate. This allows to facilitate access to the entrance to the trenches for filling them.

According to one example, the second hard mask layer is based on silicon nitride (SiN).

According to one example, the first hard mask layer is based on carbon.

According to one example, the first hard mask layer is etched during the third and fifth etchings respectively at third and fifth etching rates $v311$, $v511$ and these etching rates $v311$, $v511$ are less than or equal to etching rates $v310$, $v510$ respectively associated with the third and fifth etchings of the substrate. This allows part of the first hard mask layer to be retained at the end of the etchings allowing the at least one trench to be formed.

According to one example, the etching rate $v511$ is less than or equal to the etching rate $v512$.

According to an only optional example, the first hard mask layer has a thickness greater than or equal to $Z+(x2-x1)/2$. In the case where $v511 \leq v512 \leq v510$ and $v311 \leq v310$, this allows to retain part of the first hard mask layer at the end of the etchings allowing to form the at least one trench and the at least one second enlarged opening.

According to one example, the first etching is carried out by plasma based on oxidising species.

According to one example, the first and second etchings are carried out by plasma based on fluorocarbon species.

According to one example, the third etching is carried out by plasma based on HBr/O2 species.

According to one example, the third etching is carried out by plasma based on fluorocarbon species.

According to one example, the third etching is carried out by plasma based on fluorocarbon species and by plasma based on HBr/O2 species, successively.

According to one example, the fourth etching is carried out by oxygen or hydrogen-based plasma.

According to one example, the fifth etching is carried out by plasma based on fluorocarbon species.

According to one example, the selective removal is carried out by oxygen-based plasma.

According to one example, the method further comprises a step of filling the trenches with a dielectric material so as to form STIs.

According to one example, at least several of the etchings and preferably all the etchings are carried out in a single ICP (Inductively Coupled Plasma) etching reactor.

According to one example, the first and second etchings are carried out in a single step.

In the present application, successive etching steps are performed. The latter are numbered for clarity. This does not necessarily mean that two etchings with two consecutive numbers should be carried out immediately one after the other. Other steps or sub-steps can be inserted between these two etchings. Conversely, several numbered etchings can be performed in one step. For example, the first and second hard mask layers can be opened by the same continuous etching. The etching numbers are mentioned here as an indication to allow better monitoring of the progress of the method according to the invention. The understanding of the operating principle of this method is thus facilitated. This does not restrict said method to a determined number of steps.

Unless explicitly mentioned, it is specified that, in the context of the present invention, the relative disposition of a third layer interposed between a first layer and a second layer, does not necessarily mean that the layers are directly in contact with each other, but means that the third layer is either directly in contact with the first and second layers, or separated therefrom by at least one other layer or at least one other element.

It is specified that, within the scope of the present invention, the terms "on", "surmounts", "covers", "underlying", "opposite" and their equivalents do not necessarily mean "in contact with". Thus, for example, the deposition, transfer, bonding, assembly or application of a first layer on a second layer, does not necessarily mean that the two layers are directly in contact with one another, but means that the first layer at least partially covers the second layer by being either directly in contact therewith, or by being separated therefrom by at least one other layer or at least one other element. In particular, the second hard mask layer can generally be separated from the substrate by a thin layer of thermal oxide called padox.

Moreover, a layer can be composed of several sub-layers made of the same material or of different materials.

A substrate, a layer, a device, "based" on a material M, means a substrate, a layer, a device comprising this material M only or this material M and possibly other materials, for example alloy elements, impurities or doping elements. Thus, a layer based on silicon nitride SiN can for example comprise non-stoichiometric silicon nitride (SiN), or stoichiometric silicon nitride ($Si_3N_4$), or else a silicon oxynitride (SiON).

In the context of the present invention, the trenches more particularly designate the structures obtained after etching, that is to say empty and without filling material. The isolating wafers or STI more particularly designate the structures obtained after filling the trenches with the filling material. It is nevertheless possible that "trenches" "isolating trenches" and "STI" are used synonymously, by extension. The person skilled in the art will be able to distinguish perfectly between the structures thus designated.

The word "dielectric" describes a material whose electrical conductivity is low enough in the given application to serve as an insulator. In the present invention, a dielectric material preferably has a dielectric constant of less than 7.

The preferred dielectric material for filling the STIs in the context of the present invention is $SiO_2$. Other dielectric materials, such as SiN, however, can be considered, for example for other trench isolation applications.

The trenches produced by the method according to the invention are in particular intended to form isolation trenches, and more particularly shallow isolation trenches (STI). The latter are in majority in the methods for manufacturing transistors for the most recent technological nodes, and are used in particular for architectures based on SOI substrates. According to a non-limiting example, the depth of the trenches in the silicon is of the order of 200 nm. It is nevertheless possible to implement the method according to the invention to form other types of trenches, for example deep isolation trenches called DTI (Deep Trench Isolation).

In the present patent application, a thickness for a layer and a depth for a trench or an etching will be considered. The depth is taken in a direction normal to the front face of the substrate. The thickness at a point in the layer is taken in a direction normal to the tangent to the layer at that point.

Likewise, when one indicates that an element is located in line with another element, this means that these two elements are located on the same line perpendicular to the main plane wherein mainly one face of the substrate extends, that is to say on the same line oriented vertically in the figures.

The width is taken parallel to the front face of the substrate.

The trenches made by the method according to the invention preferably have inclined side walls. An inclination of the side walls, that is to say of the side walls not perpendicular to a plane wherein one face of the substrate mainly extends, is favourable to a deposition without formation of voids. The slope is controlled by adjusting the parameters of the plasma, in particular the amount of polymerising gas. In this case, the width of the trenches is an "average" width over the depth of the trenches. If the trenches produced have vertical and parallel side walls, the average width is simply the nominal width of these trenches.

In the following, etching rates are indicated. These rates are referenced as follows:

An etching rate vNcc corresponds to the etching rate of etching n° N of the layer cc. For example, v310 designates the etching rate of the third etching of the substrate 10. For example, v511 designates the etching rate of the fifth etching of the first hard mask layer 11.

In the case of an SOI substrate, the etching rate of that substrate is an average etching rate through the stack. In practice, the major part of the etching of the SOI substrate generally corresponds to the etching of the support layer (bulk) of this SOI substrate. The average etching rate of the SOI substrate is therefore generally close to the etching rate of the bulk.

The terms "substantially", "approximately", "of the order of" mean "within 10%" or, in the case of an angular orientation, "within 10°". Thus, a direction substantially normal to a plane means a direction having an angle of 90±10° relative to the plane.

To determine the geometry of the STIs, electron microscopy analysis can be carried out, in particular Scanning Electron Microscopy (SEM) or Transmission Electron Microscopy (TEM).

The chemical compositions of the various layers or regions can be determined using the well-known EDX or X-EDS method, acronym for "energy dispersive x-ray spectroscopy" which stands for "energy dispersive analysis of X photons". This method is well adapted for analysing the composition of regions of small dimensions such as phosphorus residues. It can be implemented on metallurgical sections within an SEM or on thin sections within a TEM.

These techniques are used in particular to determine whether the STIs have structural defects or cavities, and whether there are phosphorus residues in the STIs.

By implementing the method according to the invention, STIs without phosphorus residues are formed. The appearance of cavities in these STIs is also limited or eliminated.

Such STIs, in particular if they are formed in an SOI substrate, can therefore be an indication of the implementation of the method according to the invention. Of course, many other alternative methods are possible for determining whether a device has been made by implementing the claimed method.

This method allows to form the trenches and enlarge the second opening without resorting to the use of chemistry based on phosphorus species, and in particular based on $H_3PO_4$. In particular, the fifth etching which has the effect of enlarging the second opening does not comprise $H_3PO_4$.

An embodiment of the method for forming trenches according to the invention will now be described with reference to FIGS. 5A to 5F and the flowchart of FIG. 6.

Figure 5A:
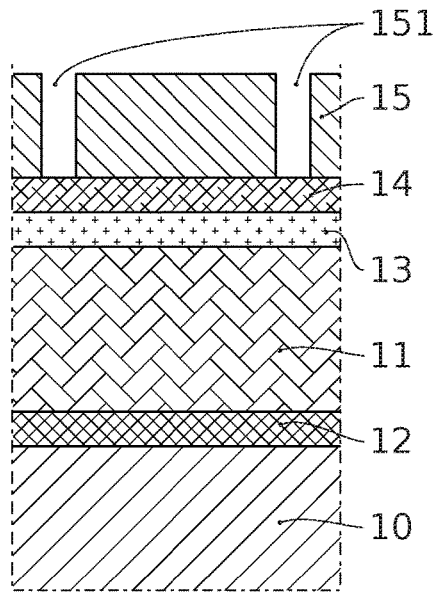
FIGS. 5A to 5F schematically illustrate in section various steps of forming trenches according to one embodiment of the present invention.
Figure 6:
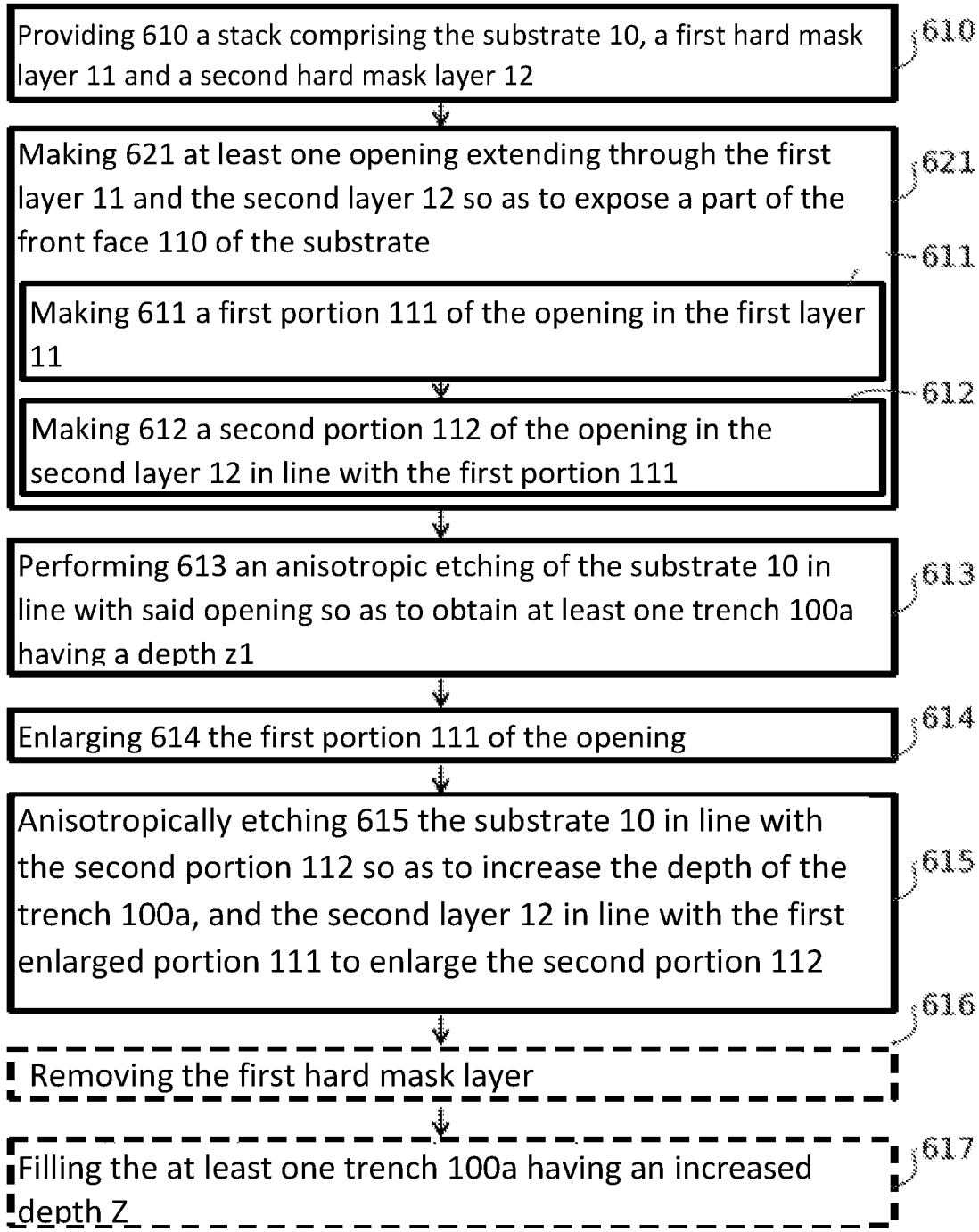
FIG. 6 summarises by a flowchart some steps of the embodiment illustrated by FIGS. 5A to 5F.

A stack comprising in a known manner the substrate 10 and a succession of front face layers 110 of the substrate 10 is first provided 610 (FIG. 5A, FIG. 6).

This succession of layers comprises, for example, from the front face of the substrate 10, a second hard mask layer 12, a first hard mask layer 11, and a third layer 13. An anti-reflection layer 14 and a photosensitive resin layer 15 can also surmount this stack so as to define by photolithography patterns of trenches with a width approximately equal to x1.

These patterns are intended to be transferred into the substrate 10 by successive etching steps, so as to form the STI trenches. The width x1 of these patterns, and therefore of the trenches, is preferably comprised between 30 nm and 100 nm, and preferably between 50 nm and 80 nm. The width x1 of a pattern is measured parallel to the main plane wherein the substrate 10 mainly extends and perpendicular to the length of the pattern, the length being the maximum dimension of the pattern in this same plane.

At the end of the etchings, the STI trenches have a depth Z. This depth Z is measured between the bottom of the trench 100a and the front face of the substrate 10 in a direction perpendicular to the main plane wherein the substrate 10 mainly extends. Preferably Z is comprised between 150 nm and 300 nm. At the end of the etchings, the STI trenches may have an inclined profile, as described in the introduction.

In this case, the side walls are inclined relative to the normal to the face of the substrate 10 from which the etching is carried out. As indicated above, this inclination of the side walls allows to facilitate the deposition without formation of voids. The inclination, that is to say the slope is controlled by adjusting the parameters of the plasma, in particular the amount of polymerising gas.

The substrate 10 may be an elaborate substrate of the semiconductor-on-insulator type, for example a silicon on insulator SOI substrate or a germanium on insulator GeOI substrate or else a silicon-germanium (SiGe) on insulator substrate.

This substrate 10 can typically comprise a solid support made of silicon, a buried oxide layer also called BOX ("Burried OXide"), having a thickness for example comprised between 10 nm and 200 nm, and an active semiconductor layer based on silicon or germanium. This active layer is preferably made of silicon (Si) or of silicon-germanium (SiGe). It has for example a thickness comprised between 5 nm and 20 nm, preferably between 5 nm and 10 nm.

In a known manner, a thin oxide layer, conventionally called padox, is preferably formed on the front face of the substrate 10. This oxide layer can be formed by oxidation of the active layer. Typically, it has a thickness of the order of 1 to 2 nm. This oxide layer is not shown in the figures. It is interposed between the substrate 10 and the second hard mask layer 12.

The second hard mask layer 12 is preferably based on silicon nitride (SiN). It can have a thickness comprised between 30 nm and 80 nm.

The first hard mask layer 11 is preferably a carbon-based layer. It can be deposited by centrifugation. It is in this case called "Spin On Hardmask" SOH. It can have a thickness comprised between 100 nm and 300 nm.

The third layer 13 is preferably based on silicon oxynitride (SiON). It can have a thickness comprised between 10 nm and 40 nm.

In a known manner, the anti-reflection layer 14 called BARC (bottom anti-reflection coating) is typically used in conjunction with the resin layer 15 to improve the photolithography.

The succession of layers typically has a height of several tens of nanometres to several hundreds of nanometres.

This succession of layers is first etched by one or more successive anisotropic etchings, in a direction substantially normal to the front face of the substrate 10, so as to expose the front face 110 of the substrate 10.

These anisotropic etchings of the materials of the layers 14, 13, 11, 12 are known to the person skilled in the art. The main parameters of anisotropic and/or isotropic etchings are detailed in the remainder of the description in the corresponding "anisotropic etching" and "isotropic etching" sections.

The trench patterns 151 made in the photosensitive resin layer 15 are typically transferred into the BARC layer 14 by anisotropic etching using a plasma based on fluorocarbon species.

These patterns 151 can then be transferred into the third SiON layer 13 by an anisotropic etching similar to the previous one, also using a plasma based on fluorocarbon species.

Figure 5B:
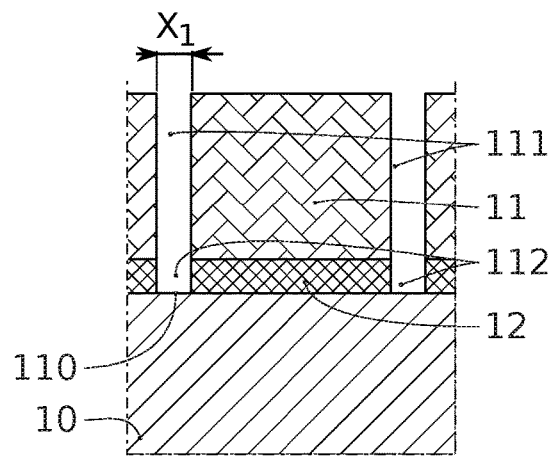

These patterns 151 are then transferred into the first hard mask layer 11 by a first anisotropic etching 611 (FIG. 5B and FIG. 6).

As illustrated in FIG. 5B, this first anisotropic etching of the first hard mask layer 11 allows to form first openings 111 as a continuation of the trench patterns and opening onto the second hard mask layer 12. These first openings 111 thus have widths substantially equal to x1.

Preferably, the first etching is controlled over time with a stop on the face of the second layer 12 facing the first layer 11.

This first anisotropic etching of the SOH layer 11 can be carried out using the same type of plasma based on fluorocarbon species as previously. Alternatively, a plasma based on oxidising species can be used to carry out this first anisotropic etching. Alternatively, a plasma based on reducing species can be used to carry out this first anisotropic etching.

The patterns are then transferred into the second hard mask layer 12 by a second anisotropic etching 612 (FIG. 5B and FIG. 6).

As illustrated in FIG. 5B, this second anisotropic etching of the second hard mask layer 12, carried out in line with the first openings 111, allows to form second openings 112 as a continuation of the first openings 111 and opening onto the front face 110 of the substrate 10. These second openings 112 thus have widths substantially equal to x1.

The second etching can be controlled over time with a stop on the face of the substrate 10 facing the second layer 12.

This second anisotropic etching of the SiN layer 12 can be carried out using the same type of plasma based on fluorocarbon species as previously.

Figure 5C:
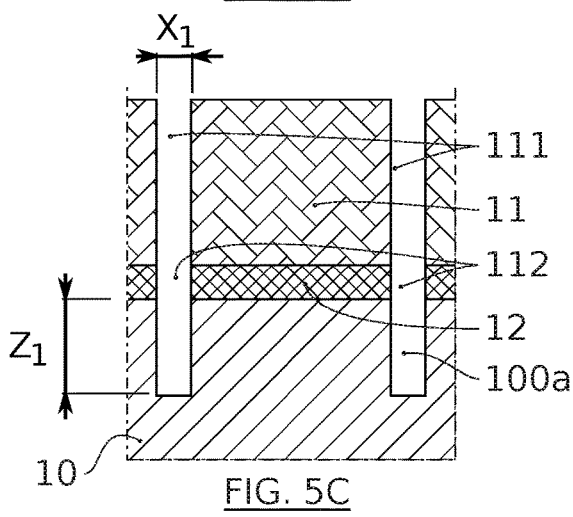

The patterns are then transferred into the substrate 10 by a third anisotropic etching 613 (FIG. 5C and FIG. 6). The substrate 10 is thus etched in line with the second openings 112.

As illustrated in FIG. 5C, this third etching allows to form trenches 100a as a continuation of the second openings 112. These trenches 100a thus have widths substantially equal to x1, and depths substantially equal to z1 with z1<Z.

Preferably, the third etching is configured to obtain trenches 100a having an inclined profile and an average width x1. For this purpose, and as indicated above, the parameters of the plasma are preferably adjusted.

This third anisotropic etching of the substrate 10 can be carried out using the same type of plasma based on fluorocarbon species as previously. This third etching allows in particular to open the padox, the active layer, the BOX, and part of the bulk silicon of an SOI substrate.

Alternatively or in combination, the partial etching of the bulk silicon during this third etching can be carried out using a plasma based on HBr/O2 species known to the person skilled in the art.

In particular, the third etching can be initiated by a plasma based on fluorocarbon species, in particular to open the BOX, then continued and terminated by a plasma based on HBr/O2, in particular to open the bulk silicon.

The first hard mask layer 11 is partially consumed during this third anisotropic etching. In particular, its thickness decreases. This reduction in thickness depends in particular on the etching rate v311 associated with the third etching of this first hard mask layer 11.

Advantageously, all of the first and second etchings and at least part of the third etching, aiming at opening the first and second hard mask layers 11, 12 and at least part of the substrate 10 comprising the BOX, can be produced by a single etching step 621 (FIG. 6), in particular using a plasma based on fluorocarbon species. This allows to reduce the total number of etching steps in the STI formation method.

The trenches 100a are thus partially formed at the end of this third etching. Their depth z1 can be comprised between a few nanometres and a few tens of nanometres.

This depth z1 depends in particular on the etching rate v310 associated with the third etching of the substrate 10.

The third etching is preferably configured such that v311≤v310. This allows to consume a thickness of the first hard mask layer 11 which is relatively smaller than the depth z1.

Figure 5D:
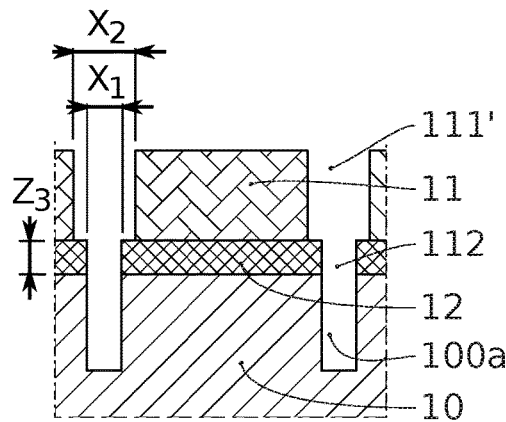

A fourth etching 614 aiming at enlarging the first openings 111 of the first hard mask layer 11 is then carried out (FIG. 5D and FIG. 6).

As illustrated in FIG. 5D, this fourth etching allows to form the first enlarged openings 111' having a width x2>x1. The width x2 is preferably comprised between 10 nm and 30 nm.

This fourth etching is preferably isotropic. It is preferably selective with respect to the materials of the second hard mask layer 12, of the liner and of the substrate 10, in particular SiN, SiO2 and Si. This fourth etching thus allows to enlarge only the first openings 111. It can be advantageously carried out using an oxygen or hydrogen-based plasma.

The thickness of the first hard mask layer 11 decreases during this fourth isotropic etching. This decrease in thickness corresponds to approximately (x2−x1)/2.

Figure 5E:
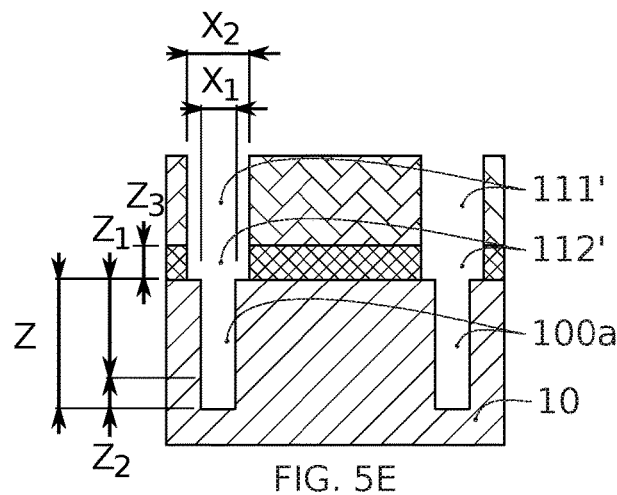

The enlargement obtained at the end of this fourth etching is then transferred to the second hard mask layer 12 by a fifth anisotropic etching 615 (FIG. 5E and FIG. 6).

This fifth etching allows to enlarge the second openings 112 as a continuation of the first enlarged openings 111'. These second enlarged openings 112' have substantially the width x2. This fifth etching of the second hard mask layer 12, aiming at enlarging the second openings 112, does not need to selectively etch the material of the second layer 12 with respect to the material of the substrate 10. Quite the contrary, the invention takes advantage of simultaneous etching of these two materials. This fifth etching is further anisotropic. The proposed solution thus allows to dispense with chemistry based on $H_3PO_4$ or phosphorus species. The proposed solution advantageously eliminates the formation of phosphorus residues generated by the known methods of STI formation. This fifth anisotropic etching can be carried out using the same type of plasma based on fluorocarbon species as before.

The fifth anisotropic etching also consumes part of the bulk silicon of an SOI substrate, over a depth z2, in line with the second openings 112.

As illustrated in FIG. 5E, the depth of the trenches 100a is thus increased.

The fifth etching is stopped before the entire thickness of the second hard mask layer 12 is consumed or at least before starting to consume portions of the substrate 10 which are in line with the first enlarged opening 111' but which are not in line with the first opening 111 before its enlargement. Thus, during this etching, the substrate 10 is etched in line with the second opening 112 (width x1). As in the third etching, it is therefore the section of the second opening 112 which defines the section of the trench 100a.

Preferably, at the end of the fifth etching, the entire thickness of the second layer 12 in line with the enlarged opening 111' is consumed. This etching is for example controlled over time with stopping the etching when the entire thickness of the second layer 12 in line with the enlarged opening 111' is consumed. The front face of the substrate 10 is then exposed in line with the second enlarged opening 112'.

These trenches 100a made in the substrate 10 have an average width x1 and a depth Z=z1+z2. The trenches 100a preferably have an inclined profile at the end of this fifth etching. For this purpose, and as indicated above, the parameters of the plasma are preferably adjusted.

The fifth anisotropic etching can be configured to be weakly selective with respect to the materials of the second hard mask layer 12 and of the substrate 10, in particular SiN and Si. This corresponds to etching rates v512 and v510 which are substantially equal. In this way, the additional etching depth z2 is substantially equal to the thickness z3 of the second hard mask layer 12, at the end of the fifth etching. Obviously, alternatively, it is possible to provide for the depth z3 to be different from the depth z2, by adjusting the etched materials, the etching solutions as well as the total depth Z of the trench 100a that one wishes to obtain.

Generally, the etching rates of the different etchings, in particular of the third and fifth etchings consuming the material of the substrate 10 to form the trenches 100a, can be adjusted so as to obtain the desired depth Z for the trenches 100a while forming the second enlarged openings 112' of width x2 and depth z3.

The fifth anisotropic etching is preferably selective with respect to the material of the padox, in particular SiO2. This allows to prevent the formation of a "recess" type defect by lateral consumption of oxide.

The first hard mask layer 11 is also partially consumed during this fifth anisotropic etching. In particular, its thickness decreases. This decrease in thickness depends in particular on the etching rate v511 associated with the fifth etching of this first hard mask layer 11.

The fifth etching is preferably configured such that v511≤v510. This allows to consume a thickness of the first hard mask layer 11 which is relatively smaller than the depth z2.

The trenches 100a are thus completely formed at the end of this fifth etching. Their depth Z=z1+z2 can be comprised between 150 nm and 300 nm.

Figure 5F:
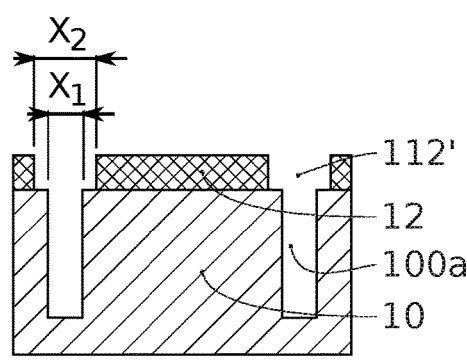

At the end of the fifth etching, the second residual SOH layer 12 can be removed 616, for example by oxygen plasma, as illustrated in FIGS. 5F and 6.

Figure 4A:
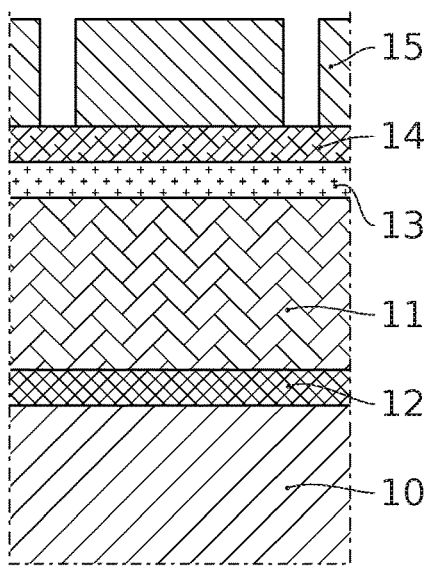
FIGS. 4A to 4G schematically illustrate in section various steps of STI formation according to a method of the prior art aiming at reducing the formation of cavities within STIs.
Figure 4B:
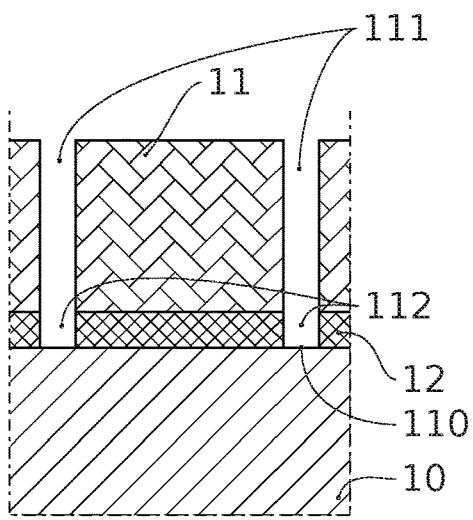
Figure 4C:
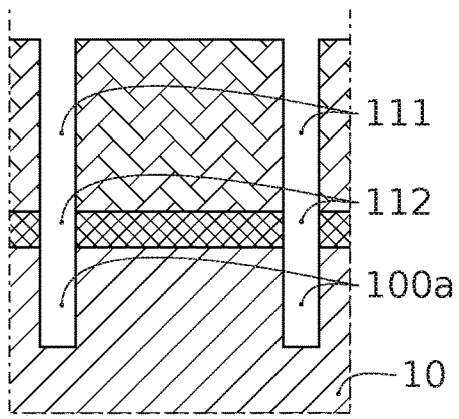
Figure 4D:
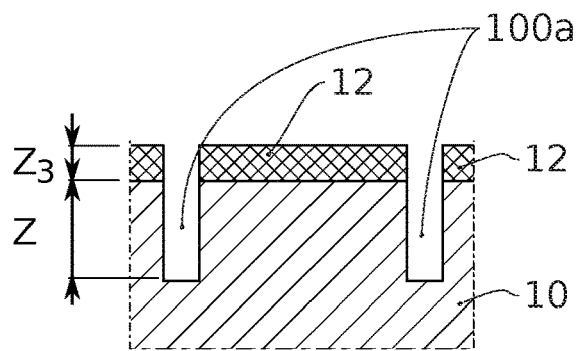
Figure 4E:
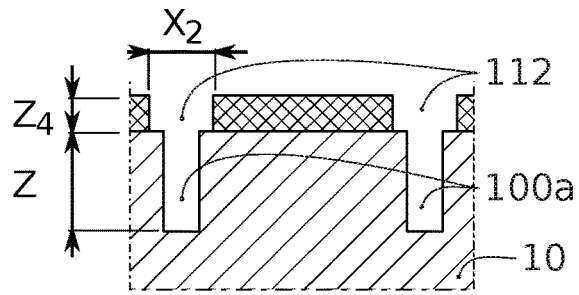
Figure 4F:
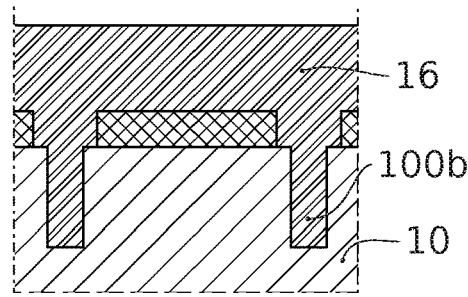
Figure 4G:
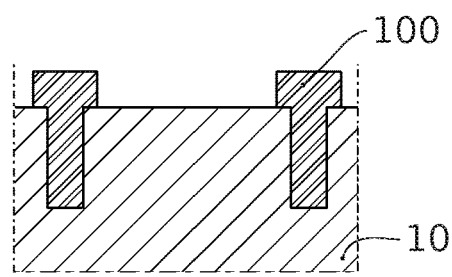

The following steps allow, in a known manner, to fill the trenches and level them so as to form isolating trenches such as STIs. These steps are similar to those illustrated in FIGS. 4F and 4G.

The trenches 100a may be filled 617 with a dielectric material such as a filler oxide 100b (not illustrated). The second enlarged openings 112' allow to improve this filling.

The excess of filler oxide 100b can be removed by chemical mechanical polishing. Then, the second hard mask layer 12 is also removed so as to form the isolating trenches 100 (not illustrated).

This method of forming isolating trenches allows in particular to enlarge the second hard mask openings while removing the phosphorus residues generally obtained by the known methods during this enlarging step.

The quality of the isolating trenches 100 thus formed is improved.

Advantageously, all the etchings are carried out within the same reactor. This allows to avoid any parasitic oxidation of the different layers and portions between each step. This also allows to simplify the method and reduce the costs.

FIG. 6 shows a flowchart summarising the main steps of the trench formation method. This method comprises at least the following successive steps:

Providing 610 a stack comprising at least the substrate 10, a first hard mask layer 11 and a second hard mask layer 12, the second layer 12 being interposed between the substrate 10 and the first layer 11, Making 621 at least one opening extending through the first layer 11 and the second layer 12 so as to expose a part of the front face 110 of the substrate in line with the opening, the opening having a first portion 111 extending through the first layer 11 and a second portion 112 extending through the second layer 12 is in line with the first portion 111, Performing 613 an anisotropic etching of the substrate 10 in line with said opening and in a main direction substantially normal to the front face of the substrate 10, so as to obtain at least one trench 100a having a depth z1, Enlarging 614 at least the first portion 111 of the opening, Etching 615 the second layer 12 and the substrate 10 in line with the first enlarged portion 111, anisotropically and in the main direction, so as to enlarge the second portion 112 of the opening and so as to increase the depth of the trench.

Optionally, removing 616 the first hard mask layer 11.

Optionally, filling 617 at least one trench 100a having an increased depth Z with a dielectric filler material.

The following paragraphs have additional, optional features which can be implemented within the framework of the method described above.

Anisotropic Etchings

The anisotropic etchings are performed in a direction substantially normal to the front face of the substrate.

These anisotropic etchings are performed by ion bombardment from a plasma.

The plasma used for these anisotropic etching steps can be a capacitive coupling (CCP) or inductive coupling (ICP) plasma.

The plasma can be based on relatively heavy and reactive species. Anisotropic etchings can lead to sputtering the different layers. To this end, heavy ions such as argon (Ar), fluorine (F) or bromine (Br) can be used.

In order to obtain anisotropic etchings, at least one of the following plasma parameters is preferably used:

The pressure within the reactor is less than 80 milli Torr, and preferably in the order of 10 milli Torr. This allows to have ions mainly directed in a direction normal to the front face of the substrate.

The bias voltage is preferably greater than 50V, so as to accelerate and direct the ions in a direction normal to the front face of the substrate.

Isotropic Etchings

Conversely, isotropic etchings are performed in all directions of space.

To promote approximately equal etching rates in the directions parallel and normal to the front face of the substrate, at least one of the following plasma parameters is preferably used:

The pressure within the reactor is greater than 80 milli Torr, for example in the order of 100 milli Torr. This allows to obtain a high ion density promoting collisions/repulsions between ions.

The bias voltage is preferably zero.

These parameters do not favour any particular direction for the movement of the ions.

The anisotropic and isotropic etching conditions are for example determined by simulation using simulation tools of the SRIM (stopping and range of ions matter) or TRIM (transport simulation of ions in matter) type.

The invention is not limited to the embodiments described but extends to any embodiment falling within the scope of claim 1.

The invention claimed is:

1. A method for forming at least one trench to be filled with an isolating material to form an isolating trench, in a substrate based on a semiconductor material, the method comprising at least the following successive steps:
providing a stack comprising at least the substrate, a first hard mask layer, and a second hard mask layer, the second hard mask layer being interposed between the substrate and the first hard mask layer;
providing a photosensitive resin layer on top of the stack;
making at least a first opening and a second opening extending respectively through the photosensitive resin layer, the first hard mask layer, and the second hard mask layer, the first opening being made by a first anisotropic etching of the photosensitive resin layer and the first hard mask layer, so as to form trench patterns that extend through the first hard mask layer and to expose at least part of the second hard mask layer, the second opening being made by a second anisotropic etching of the second hard mask layer in line with the first opening so as to expose a part of a front face of the substrate in line with the second opening;
performing a third, anisotropic, etching of the substrate in line with the second opening, so as to obtain the at least one trench in the substrate;
performing a fourth, isotropic, etching of the first hard mask layer so as to enlarge the first opening and obtain a first enlarged opening; and
performing a fifth, anisotropic, etching of the second hard mask layer in line with the first enlarged opening and of the substrate in line with the second opening, so as to simultaneously enlarge the second opening and increase a depth of the at least one trench,
the first and the second anisotropic etchings and at least part of the third anisotropic etching being implemented using a plasma based on fluorocarbon species.

2. The method according to claim 1, wherein the substrate is a silicon-on-insulator (SOI)-type substrate comprising a layer made of a semiconductor material, a support layer, and a buried oxide layer interposed between the layer made of the semiconductor material and the support layer.

3. The method according to claim 1,
wherein at an end of the third anisotropic etching the trench has a depth z1, and
wherein the second hard mask layer has a thickness z3 and the fifth, anisotropic, etching is configured so as to etch the second hard mask layer along the thickness z3 for an etching time t at an etching rate v512, and to etch the substrate to a depth z2 for the same etching time t, at an etching rate v510, such that Z=z1+z2, Z being a depth of the trench at an end of the fifth, anisotropic, etching.

4. The method according to claim 3, wherein the etching rates v512 and v510 are equal so that z2=z3.

5. The method according to claim 1, further comprising, after the fifth, anisotropic, etching, a selective removal of the first hard mask layer with respect to the second hard mask layer and the substrate.

6. The method according to claim 1, wherein the second hard mask layer is based on silicon nitride (SiN).

7. The method according to claim 1, wherein the first hard mask layer is a carbon-based layer.

8. The method according to claim 1,
wherein the first hard mask layer is etched during the third, anisotropic, etching and the fifth, anisotropic, etching respectively at third and fifth etching rates v311, v511, and
wherein the etching rates v311, v511 are less than or equal to etching rates v310, v510 respectively associated with the third, anisotropic, etching and the fifth, anisotropic, etching of the substrate.

9. The method according to claim 1, wherein the fifth, anisotropic, etching is stopped before consuming the entire second hard mask layer in line with the first enlarged opening.

10. The method according to claim 1, wherein the third, anisotropic, etching is carried out by plasma based on at least one of the following families of species: species based on HBr with added O2, fluorocarbon species.

11. The method according to claim 1, wherein the fourth, isotropic, etching is carried out by oxygen or hydrogen-based plasma.

12. The method according to claim 1, wherein the second and the fifth anisotropic etchings are carried out by plasma based on fluorocarbon species.

13. The method according to claim 5, wherein the selective removal is carried out by oxygen-based plasma.

14. The method according to claim 1, further comprising a step of filling the at least one trench with a dielectric material.

15. The method according to claim 1, wherein at least several of the etchings are carried out in a single inductively couple plasma (ICP) etching reactor.

16. The method according to claim 1, wherein all of the etchings are carried out in a single inductively couple plasma (ICP) etching reactor.

17. The method according to claim 1, wherein the first and the second anisotropic etchings are carried out in a single step.

18. A method for forming an isolation trench comprising formation of a trench by implementing the method according to claim 1, and at least one step of filling the trench with an isolating material.

* * * * *